United States Patent
Park et al.

(10) Patent No.: US 8,958,229 B2
(45) Date of Patent: Feb. 17, 2015

(54) NONVOLATILE MEMORY DEVICE AND METHOD OF FABRICATING SAME

(75) Inventors: Jae-Hyun Park, Yongin-si (KR);
Jae-Hee Oh, Seongnam-si (KR);
Sung-Won Kim, Gwangju (KR)

(73) Assignee: Samsung Electronics Co., Ltd. (KR)

( * ) Notice: Subject to any disclaimer, the term of this patent is extended or adjusted under 35 U.S.C. 154(b) by 974 days.

(21) Appl. No.: 13/089,555

(22) Filed: Apr. 19, 2011

(65) Prior Publication Data
US 2011/0305058 A1 Dec. 15, 2011

(30) Foreign Application Priority Data
Jun. 11, 2010 (KR) ........................ 10-2010-0055689

(51) Int. Cl.
*G11C 5/06* (2006.01)
*H01L 23/50* (2006.01)
*G11C 8/14* (2006.01)
*G11C 13/00* (2006.01)
*H01L 27/24* (2006.01)
*H01L 27/105* (2006.01)

(52) U.S. Cl.
CPC *G11C 5/063* (2013.01); *G11C 8/14* (2013.01);
*G11C 13/0004* (2013.01); *G11C 13/0007*
(2013.01); *G11C 13/0028* (2013.01); *H01L*
*27/2436* (2013.01); *H01L 27/105* (2013.01)
USPC ................. 365/63; 365/148; 257/5; 257/776; 257/E23.151

(58) Field of Classification Search
CPC ............ G11C 5/06; G11C 5/063; G11C 7/18;
G11C 13/0002; G11C 13/0021; H01L 23/5226; H01L 23/528; H01L 23/5283; H01L 45/04; H01L 45/122; H01L 45/123; H01L 27/2463; H01L 27/2481
USPC ........ 365/63, 148; 257/5, 774, 776, E45.002, 257/E27.004, E23.145, E23.151, E23.152
See application file for complete search history.

(56) References Cited

U.S. PATENT DOCUMENTS

| | | | |
|---|---|---|---|
| 6,980,462 B1 * | 12/2005 | Ramesh et al. | 365/154 |
| 7,009,208 B2 * | 3/2006 | Aratani et al. | 257/74 |
| 7,589,367 B2 * | 9/2009 | Oh et al. | 257/296 |
| 7,639,558 B2 | 12/2009 | Cho et al. | |
| 2006/0291277 A1 | 12/2006 | Cho et al. | |
| 2009/0059644 A1 * | 3/2009 | Kajigaya | 365/72 |

FOREIGN PATENT DOCUMENTS

| | | |
|---|---|---|
| JP | 2009-76596 | 4/2009 |
| KR | 10-2006-0002617 | 1/2006 |
| KR | 10-2006-0134308 | 12/2006 |

* cited by examiner

*Primary Examiner* — Allison P Bernstein
(74) *Attorney, Agent, or Firm* — Onello & Mello, LLP

(57) ABSTRACT

A nonvolatile memory device includes multiple variable resistive elements formed on a substrate; multiple bit lines formed on the variable resistive elements, extended in a first direction, and separated from each other by a first pitch; multiple circuit word lines formed on the multiple bit lines, extended in a second direction, and separated from each other by a second pitch; and multiple circuit word lines formed on the multiple bit lines, extended in the first direction, and separated from each other by a third pitch, wherein the third pitch of the multiple circuit word lines is larger than the first pitch of the multiple bit lines.

18 Claims, 6 Drawing Sheets

FIG. 1

| 10_1 | 10_2 | 10_3 | 10_4 | 10_5 | 10_6 | 10_7 | 10_8 |
|---|---|---|---|---|---|---|---|
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| SA/WD(20_1) | | SA/WD(20_2) | | SA/WD(20_3) | | SA/WD(20_4) | |
| PERIPHERY(30) | | | | | | | |
| SA/WD(20_8) | | SA/WD(20_7) | | SA/WD(20_6) | | SA/WD(20_5) | |
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| 10_16 | 10_15 | 10_14 | 10_13 | 10_12 | 10_11 | 10_10 | 10_9 | ns
NONVOLATILE MEMORY DEVICE AND METHOD OF FABRICATING SAME

CROSS-REFERENCE TO RELATED APPLICATIONS

This application claims priority from Korean Patent Application No. 10-2010-0055689, filed on Jun. 11, 2010 in the Korean Intellectual Property Office, the entire contents of which are incorporated herein by reference.

BACKGROUND

1. Field of the Invention

The present inventive concept relates to a nonvolatile memory device and a method of fabricating the nonvolatile memory device, and more particularly, to a nonvolatile memory device using a resistive element and a method of fabricating the nonvolatile memory device.

2. Description of the Prior Art

Nonvolatile memory devices are memory devices which retain their stored data when power is interrupted. Some nonvolatile memory devices use resistance materials in storing data. These nonvolatile memory devices which use resistance materials include PRAMs (Phase change Random Access Memory), RRAMs (Resistive RAM), and MRAMs (Magnetic RAM). PRAM memory devices store data using phase change of certain phase-change materials such as chalcogenide alloys. RRAM memory devices store data using the resistance change of variable resistive elements and the resistance change of MTJ (Magnetic Tunnel Junction) thin films according to the magnetization state of a ferromagnetic substance. DRAMs (Dynamic Random Access Memory) and flash memory devices store data using charge.

SUMMARY

The present inventive concept provides a nonvolatile memory device and a method of fabricating a nonvolatile memory device with improved reliability and reduced core structure area.

The aspects, features and advantages of the present inventive concept are not restricted to those set forth herein. The above and other aspects, features and advantages of the present inventive concept will become more apparent to one of ordinary skill in the art to which the present inventive concept pertains by referencing the detailed description of the present inventive concept provided herein.

According to another aspect, the inventive concept is directed to a nonvolatile memory device, comprising: a plurality of variable resistive elements formed on a substrate; a plurality of bit lines formed on the variable resistive elements, the bit lines being extended in a first direction and separated from each other by a first pitch; a plurality of cell word lines formed on the bit lines, the cell word lines being extended in a second direction and separated from each other by a second pitch; and a plurality of circuit word lines formed on the bit lines, the circuit word lines being extended in the first direction and separated from each other by a third pitch, wherein the third pitch of the circuit word lines is larger than the first pitch of the bit lines.

In some embodiments, the third pitch of the circuit word lines is about twice as large as the first pitch of the bit lines.

In some embodiments, each of the bit lines is electrically connected to each of the circuit word lines.

In some embodiments, the substrate includes a cell array region and a peripheral circuit region, the bit lines including first through nth bit lines arranged in order, the circuit word line including first through nth circuit word lines that correspond to the first through the nth bit lines, and the bit lines and the circuit word lines being electrically connected at the peripheral circuit region.

In some embodiments, the peripheral circuit region includes a first peripheral circuit region formed on one side of the cell array region and a second peripheral circuit region formed on another side of the cell array region, at least some of the first through the nth circuit word lines being disposed on the first peripheral circuit region, and some of remaining first through nth circuit word lines being disposed on the second peripheral circuit region, wherein n is an integer greater than or equal to 2.

In some embodiments, odd numbered lines from the first through the nth circuit word lines are disposed on the first peripheral circuit region, and even numbered lines from the first through the nth circuit word lines are disposed on the second peripheral circuit region.

In some embodiments, each of the first through nth bit lines is electrically connected to each of the first through nth circuit word lines through a first through an nth via contact, some of the first through the nth via contacts being disposed on the first peripheral circuit region, and some of remaining first through nth via contacts are on the second peripheral circuit region.

In some embodiments, the first through the nth via contacts have a square shape.

In some embodiments, each of the first through nth bit lines are electrically connected to each of the first through nth circuit word lines through via contacts, each of the first through nth bit lines including one side and another side, some of the first through nth bit lines being electrically connected to some of the first through nth circuit word lines at the one side through the via contacts, and some of remaining first through nth bit lines being electrically connected to some of remaining first through nth circuit word lines at the other side through the via contacts.

In some embodiments, odd numbered bit lines from the first through nth bit lines are electrically connected to some of the first through the nth circuit word lines at the one side, and even numbered bit lines from the first through nth bit lines are electrically connected to some of remaining first through nth circuit word lines at the other side.

In some embodiments, the via contact has a square shape.

According to another aspect, the inventive concept is directed to a nonvolatile memory device, comprising: a substrate including a cell array region, a first peripheral circuit region formed on one side of the cell array region, and a second peripheral circuit region formed on another side of the cell array region; first through nth bit lines extended in a first direction, formed on the substrate, separated each other, and disposed in order; first through mth cell word lines formed on the first through the nth bit lines, extended in a second direction, separated each other, and disposed in order; and first through nth circuit word lines formed on the first through mth word lines, extended in the first direction, corresponding to the first through the nth bit lines, respectively, separated from each other, and disposed in order, wherein some of the first through nth circuit word lines are disposed on the first peripheral circuit region, and some of remaining first through nth circuit word lines are disposed on the second peripheral circuit region, wherein n and m are integers greater than or equal to 2.

In some embodiments, odd numbered circuit word lines from the first through nth circuit word lines are disposed on the first peripheral circuit region, and even numbered circuit word lines from the first through nth circuit word lines are disposed on the second peripheral circuit region.

In some embodiments, each of the first through nth bit lines is electrically connected to each of the first through nth circuit word lines through a via contact, each of the first through nth bit lines including one side and another side, some of the first through nth bit lines being electrically connected to some of the first through nth circuit word lines at the one side through the via contacts, and some of remaining first through nth bit lines being electrically connected to some of remaining first through nth circuit word lines at the other side through the via contacts.

In some embodiments, odd numbered bit lines from the first through nth bit lines are electrically connected to some of the first through nth circuit word lines at the one side, and even numbered bit lines from the first through nth bit lines are electrically connected to some of remaining first through nth circuit word lines at the other side.

In some embodiments, the via contact has a square shape.

According to another aspect, the inventive concept is directed to a nonvolatile memory device, comprising: a plurality of variable resistive elements formed on a substrate; a plurality of bit lines formed on the variable resistive elements, the bit lines being extended in a first direction and separated from each other by a first pitch; a plurality of cell word lines formed on the bit lines, the cell word lines being extended in a second direction and separated from each other by a second pitch; and a plurality of circuit word lines formed on the bit lines, the circuit word lines being extended in the first direction and separated from each other by a third pitch, wherein the third pitch of the circuit word lines is about twice as large as the first pitch of the bit lines. Each of the bit lines is electrically connected to each of the circuit word lines. The substrate includes a cell array region and a peripheral circuit region, the bit lines including first through nth bit lines arranged in order, the circuit word line including first through nth circuit word lines that correspond to the first through the nth bit lines, and the bit lines and the circuit word lines being electrically connected at the peripheral circuit region. The peripheral circuit region includes a first peripheral circuit region formed on one side of the cell array region and a second peripheral circuit region formed on another side of the cell array region, at least some of the first through the nth circuit word lines being disposed on the first peripheral circuit region, and some of remaining first through nth circuit word lines being disposed on the second peripheral circuit region, wherein n is an integer greater than or equal to 2.

In some embodiments, odd numbered lines from the first through the nth circuit word lines are disposed on the first peripheral circuit region, and even numbered lines from the first through the nth circuit word lines are disposed on the second peripheral circuit region.

In some embodiments, each of the first through nth bit lines is electrically connected to each of the first through nth circuit word lines through a first through an nth via contact, some of the first through the nth via contacts being disposed on the first peripheral circuit region, and some of remaining first through nth via contacts are on the second peripheral circuit region.

In some embodiments, the first through the nth via contacts have a square shape.

BRIEF DESCRIPTION OF THE DRAWINGS

The foregoing and other features and advantages of the inventive concept will be apparent from the more particular description of preferred embodiments of the inventive concept, as illustrated in the accompanying drawings in which like reference characters refer to the same parts throughout the different views. The drawings are not necessarily to scale, emphasis instead being placed upon illustrating the principles of the inventive concept. In the drawings, the thickness of layers and regions may be exaggerated for clarity.

FIGS. 1 and 2 contain schematic diagrams illustrating a nonvolatile memory device according to exemplary embodiments of the present inventive concept.

DETAILED DESCRIPTION

Figure 2:
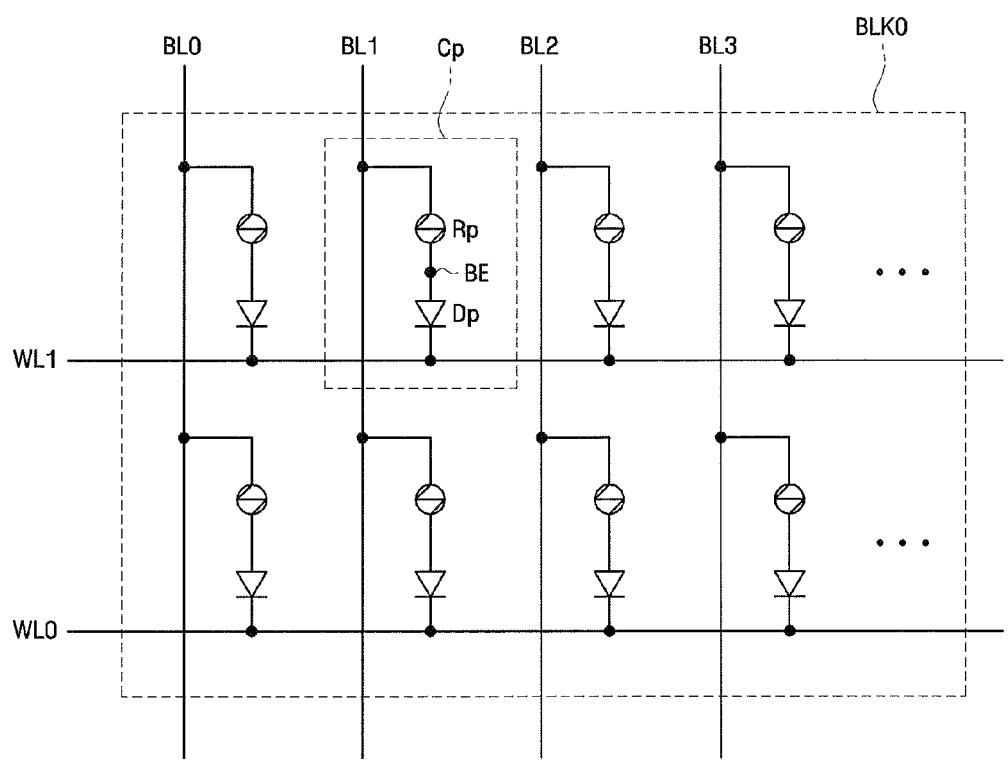

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this description will be thorough and complete and will fully convey the concept of the inventive concept to those skilled in the art, and the present inventive concept will only be defined by the appended claims. Like reference numerals refer to like elements throughout the specification and drawings.

It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Embodiments described herein will be described referring to plan views and/or cross-sectional views by way of ideal schematic views of the inventive concept. Accordingly, the exemplary views may be modified depending on manufacturing technologies and/or tolerances. Therefore, the embodiments of the inventive concept are not limited to those shown in the views, but include modifications in configuration formed on the basis of manufacturing processes. Therefore, regions exemplified in figures have schematic properties and shapes of regions shown in figures exemplify specific shapes of regions of elements and do not limit aspects of the inventive concept.

Hereinafter, although exemplary embodiments of the present inventive concept will be described as using a phase change random access memory PRAM as an illustrative example, it is clear to those skilled in this art that the present inventive concept can be applied to other types of nonvolatile memory devices using a resistive element, such as resistive RAM (RRAM) and magnetic RAM (MRAM). Furthermore, in other exemplary embodiments, it is clear to those skilled in this art that the present inventive concept can be applied to DRAM or flash memory devices, in addition to nonvolatile memory devices using a resistive element.

FIGS. 1 and 2 contain schematic diagrams illustrating a nonvolatile memory device according to exemplary embodiments of the present inventive concept. In the detailed description of exemplary embodiments of the present inventive concept contained herein, a device having a quantity of memory banks of 16 is used as an example. It will be understood that the inventive concept is applicable to any number of memory banks, and that the inventive concept is not limited to this illustrative example. Also, for the purpose of clarity of the description and drawings, FIG. 2 illustrates only a portion of the memory device, specifically, the area of the memory device associated with a first memory block BLK0.

Referring to FIG. 1, a nonvolatile memory device according to exemplary embodiments of the present inventive concept includes multiple memory banks labeled 10_1 through 10_16, multiple sense amplifiers and write drivers labeled SA/WD(20_1) through SA/WD(20_8), and a peripheral circuit region labeled PERIPHERY(30).

Each of the multiple memory banks 10_1-10_16 can be composed of multiple memory blocks, e.g., BLK0-BLK7, and each memory block BLK0-BLK7 includes multiple memory cells arranged in a matrix fashion. In the present application, the exemplary embodiments of the present inventive concept are illustrated and described as having an arrangement of eight memory blocks BLK0 BLK7. It will be understood that the inventive concept is applicable to any number of memory blocks.

Also, although not shown in the drawings, the memory device illustrated in FIG. 1 also includes a column decoder and a row decoder, corresponding to the memory banks 10_1-10_16, which select the column and the row, respectively, of addressed nonvolatile memory cells to be read from or written to.

As illustrated in FIG. 1, each sense amplifier and write driver 20_1-20_8 corresponds to two memory banks 10_1-10_16 and perform read and write operations on the memory banks. In the exemplary embodiments of the present inventive concept, although each sense amplifier and write driver 20_1-20_8 are shown in this exemplary embodiment to correspond to two memory banks 10_1 -10_16, the present inventive concept is not limited to that configuration. That is, the inventive concept is applicable to other sense amplifier/write driver configurations. Thus, the sense amplifier and the write driver 20_1-20_8 can correspond to one memory bank or four memory banks, for example.

Multiple logic circuit blocks and a voltage generator that drive the column decoder, the row decoder, and the sense amplifier and write driver are formed in the peripheral circuit region 30.

FIG. 2 contains a schematic diagram of detail of a portion of a memory block illustrated in FIG. 1, for example, memory block BLK0. Referring to FIG. 2, the memory block BLK0 of the nonvolatile memory device according to the exemplary embodiments of the present inventive concept, includes multiple memory cells Cp, multiple bit lines BL0-BL3, and multiple word lines WL0 and WL1. IN some embodiments, the multiple memory cells Cp are disposed in an area where the word lines WL0 and WL1 and the bit lines BL0-BL3 cross. In a PRAM memory device, the memory cell Cp can be in crystal state or amorphous state depending on penetrating current, and includes a variable resistive element Rp that has a different resistance value for each of the crystal and amorphous states. A vertical cell diode Dp may be connected to the variable resistive element Rp through a bottom electrode BE, which controls the current that penetrates the variable resistive element Rp to program the cell. Here, the variable resistive element Rp is composed of a phase-change element and can be composed of various materials, such as two atomic compounds such as GaSb, InSb, InSe, $Sb_2Te_3$, or GeTe, three atomic compounds such as GeSbTe, GaSeTe, InSbTe, $SnSb_2Te_4$, or InSbGe, or four atomic compounds such as AgInSbTe, (GeSn)SbTe, GeSb(SeTe), or $Te_{51}Ge_{15}Sb_2S_2$. For example, the variable resistive elements Rp can include GeSbTe which consists of germanium Ge, antimony Sb, and tellurium Te. In the drawing, although the variable resistive element Rp is illustrated to be coupled with the bit lines BL0-BL3 and the vertical cell diode Dp is coupled with the word lines WL0 and WL1, the opposite configuration can be used according to embodiments of the inventive concept. That is, the inventive concept is applicable to a configuration in which the variable resistive element Rp is coupled with the word lines WL0 and WL1 and the vertical cell diode Dp is coupled with the bit lines BL0 -BL3.

Hereinafter, referring to FIG. 2, operations of the nonvolatile memory device are described.

Write operation of the nonvolatile memory device described in accordance with the following. By heating the variable resistive element Rp above the melting temperature Tm followed by fast cooling, the variable resistive element Rp can be programmed to the amorphous state, which is logic level 1. Also, by heating the variable resistive element Rp above the crystallization temperature Tx and under the melting temperature Tm and maintaining the heating temperature for a predetermined time followed by cooling, Rp can be programmed to the crystal state, which is logic level 0. To change the phase of the variable resistive element Rp, a significantly high level of write current penetrates the variable resistive element Rp. For example, a write current of about 1 mA is used for reset and a write current of about 0.6 mA—about 0.7 mA is used for set. Such write current is generated by a write circuit (not shown) and flows through the bit lines BL0-BL3, the vertical cell diode Dp, and ground voltage.

Read operation of the nonvolatile memory device can be accomplished by reading stored data by providing the variable resistive element Rp with a read current whose level does not allow the variable resistive element Rp to be phase-changed. Such a read current is generated by a read circuit (not shown) and flows through the bit line BL0-BL3, the vertical cell diode Dp, and ground voltage.

Figure 3:
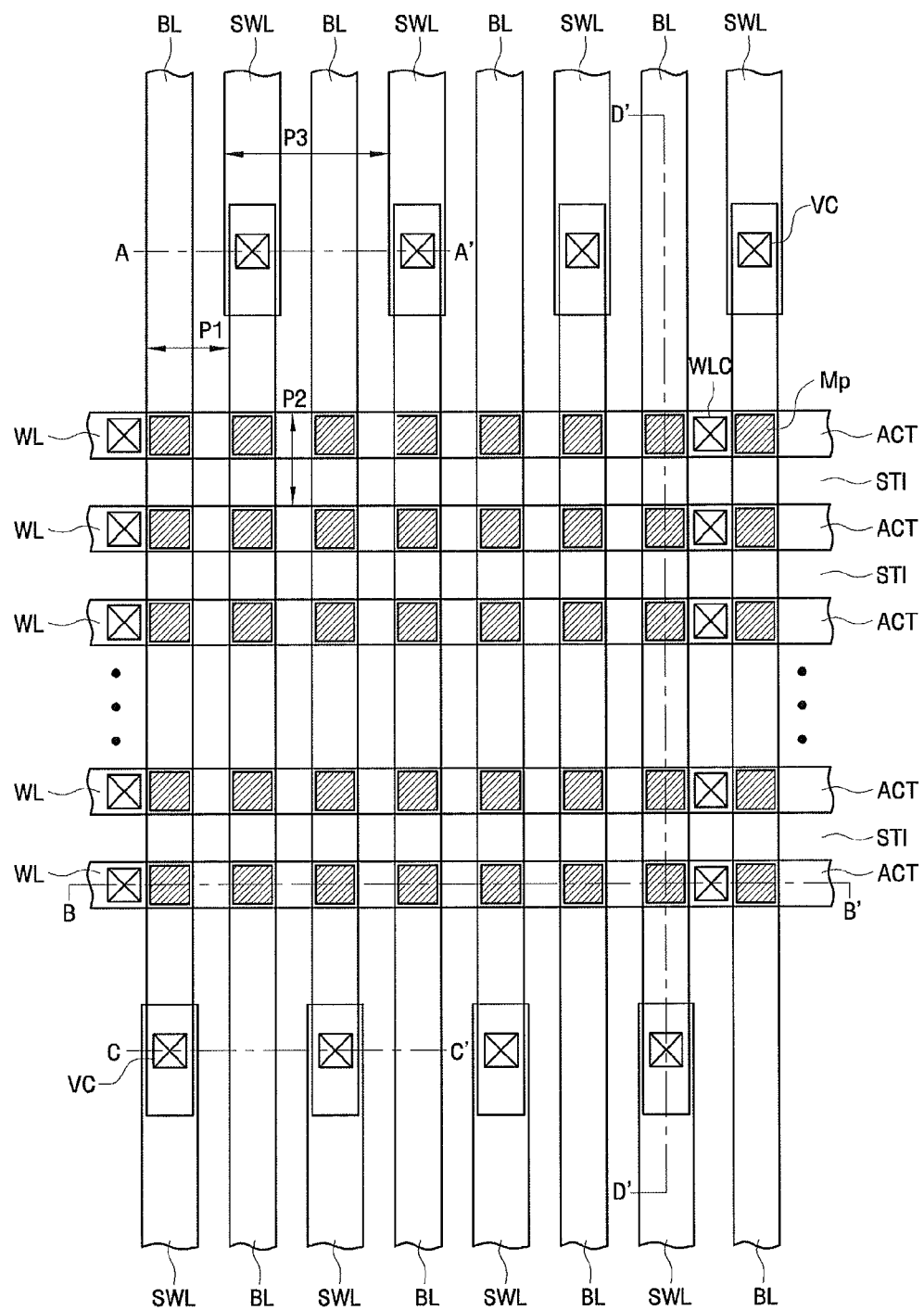
FIG. 3 is a schematic layout diagram illustrating a nonvolatile memory device according exemplary embodiments of the present inventive concept.
Figure 4:
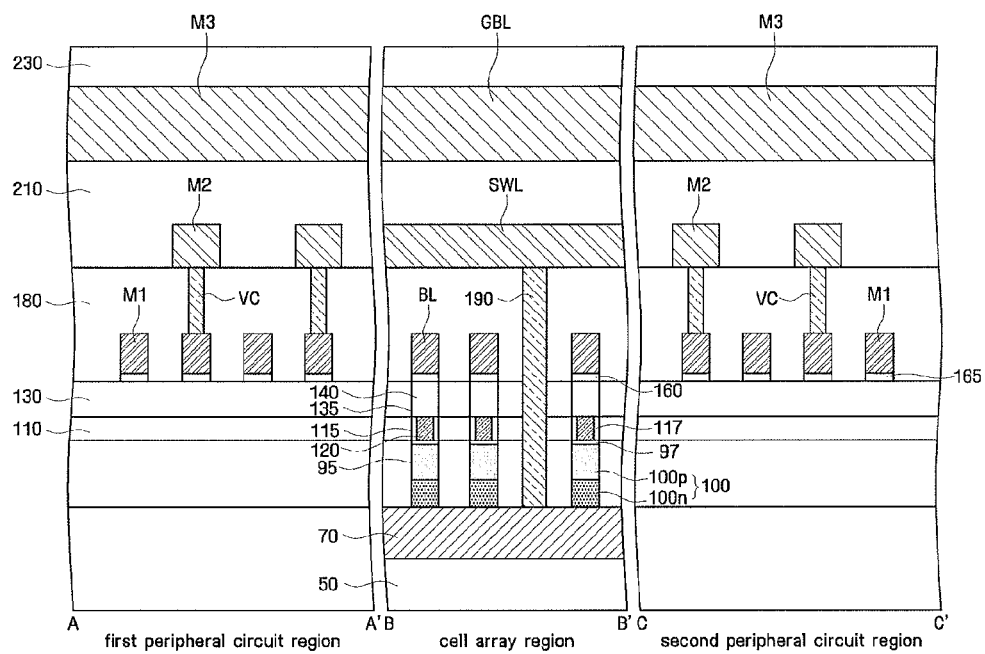
FIG. 4 contains schematic sectional views taken along lines of A-A', B-B', and C-C' of FIG. 3.
Figure 5:
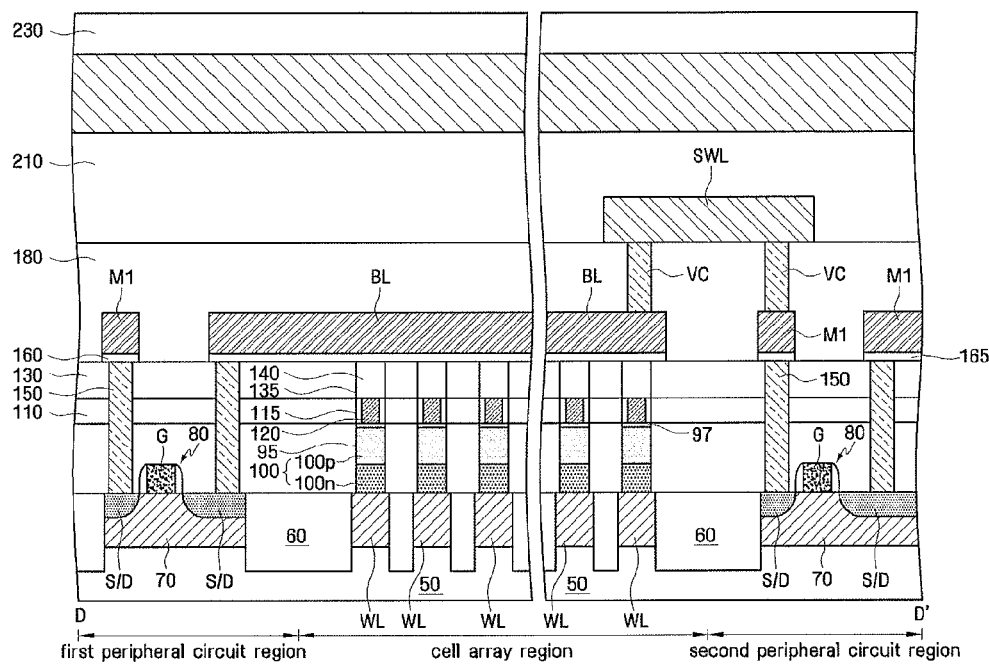
FIG. 5 contains a schematic sectional view taken along a line of D-D' of FIG. 3.

FIG. 3 is a schematic layout diagram illustrating an exemplary layout of a nonvolatile memory device according exemplary embodiments of the present inventive concept. FIG. 4 contains schematic sectional views taken along lines of A-A', B-B', and C-C' of FIG. 3. FIG. 5 contains a schematic sectional view taken along a line of D-D' of FIG. 3.

Referring to FIGS. 3 through 5, a nonvolatile memory device according to the exemplary embodiments of the present inventive concept includes a substrate 50, multiple bit lines BL, multiple cell word lines WL, and multiple circuit word lines WL.

As illustrated in FIG. 3, the nonvolatile memory device according to the exemplary embodiments of the present inventive concept includes the multiple bit lines BL extended in a first direction and formed on a substrate 50 and separated from each other by a first pitch P1. The multiple cell word lines WL extend in a second direction and are separated from each other by a second pitch P2. Multiple circuit word lines SWL extend in the first direction and are separated from each other by a third pitch P3. Here, the third pitch P3 of the multiple circuit word lines WL is larger than the first pitch P1 of the multiple bit lines BL.

The substrate 50 can include an element region ACT with a shape of a stripe pattern extended in the first direction, for example, a row direction. The element region ACT can be defined as the word line WL by implanting impurities. A device isolation region STI can be formed in an area other than the element region ACT. Thus, the element region ACT can be defined by the element isolation region STI.

The bit line BL extended in the second direction, for example a column direction, with a stripe pattern shape can be formed such that it crosses the word line WL. In an area where the word lines WL and the bit lines BL cross, a memory cell can be formed. In the exemplary embodiments of the present inventive concept, the memory cell can include a resistive memory element Mp such as a phase change memory element. One side of the resistive memory element Mp can be connected to the bit line BL, and the other side can be connected to the word line WL. In some embodiments, a selection element can be placed between the word line WL and the other side of the resistive memory element Mp.

Furthermore, the substrate 50 can include a cell array region where multiple memory cells are defined and a peripheral circuit region where multiple logic circuit blocks and a voltage generator are formed. Also, as illustrated in FIGS. 3 and 5, the peripheral circuit region can include a first peripheral circuit region formed on one side of the cell array region and a second peripheral circuit region formed on the other side of the cell array region.

Referring to FIGS. 3 through 5, the multiple word lines WL are provided on the substrate 50. The multiple word lines WL, for example, can be formed by doping n-type impurities into a semiconductor layer. In other exemplary embodiments, the multiple word lines WL can be formed with metallic thin film. The adjacent multiple word lines WL can be electrically isolated by a dielectric layer including a device isolation layer 60. A drive element to drive the cell array region, for example, a drive transistor 80, can be provided in the peripheral circuit region, on an active region 70 defined by the device isolation layer 60. On the substrate 50, the multiple bit lines BL are formed to cross the multiple word lines WL.

A first metal interconnection M1 that corresponds to the bit line BL can be formed in the peripheral region. The first metal interconnection M1 can be electrically connected to a gate G or source/drain regions S/D of the drive transistor 80. The bit line BL and the first metal interconnection M1 can be formed with metallic thin film. The word line WL can be provided in the substrate 50 or on the substrate 50, and for example, can be a semiconductor layer doped with n-type impurities. When the word line WL is formed with a semiconductor layer, the semiconductor layer for the word line can be formed by doping impurities into a predetermined area of the substrate 50, or it can be formed by forming an epitaxial semiconductor layer on the substrate 50 followed by doping impurities into the epitaxial semiconductor layer. Also, the semiconductor layer for the word line can be formed during the formation of the epitaxial semiconductor layer by doping impurities. In some embodiments, the word line WL can be formed with a metallic thin film.

In the peripheral region, the first interconnection M1 can be electrically connected to the drive element, for example, the gate G and the source/drain S/D of the drive transistor 80 through a contact plug 150. A phase change material layer 140 that functions as data storage can be formed between the word line WL and the bit line BL.

A first electrode 120 and a selection element 100 can be formed between the phase change material layer 140 and the word line WL, and a second electrode 160 can be formed between the phase change material layer 140 and the bit line BL. Thus, the first electrode 120 and the second electrode 160 can be electrically connected to opposite sides of the phase change material layer 140. The first electrode 120 can be used as a heater to heat the phase change material layer 140. The first electrode 120 can be electrically connected to the word line WL through a selection element, for example, a diode 100, which includes a p-type region 100p and an n-type region 100n. In the drawings, although the phase change material layer 140 is illustrated as being aligned with the bit line BL and formed in an island shape, in other exemplary embodiments the memory cell including the phase change material layer 140 can be formed in a stripe type extended in the bit line BL direction.

The second electrode 160 can be electrically connected to the bit line BL. The first electrode 120 that corresponds to the phase change material layer 140 can be thus provided. The second electrode 160 can be commonly connected to the multiple phase change material layers provided in the direction of the bit line. Also, similar to the first electrode 120, the second electrode 160 that corresponds to each phase change material layer can be provided. Also, in the peripheral region a barrier metal 165 that corresponds to the second electrode 160 of the cell array region can be provided between the first metal interconnection M1 and the contact plug 150.

The first electrode 120 and the second electrode 160 can be formed with metallic thin film. For example, the first electrode 120 can be at least one material selected from the group consisting of titanium nitride (TiN), titanium aluminum nitride (TiAlN), tantalum nitride (TaN), tungsten nitride (WN), molybdenum nitride (MoN), niobium nitride (NbN), titanium silicon nitride (TiSiN), titanium boron nitride (TiBN), zirconium silicon nitride (ZrSiN), tungsten silicon nitride (WSiN), tungsten boron nitride (WBN), zirconium aluminum nitride (ZrAlN), molybdenum aluminum nitride (MoAlN), tantalum silicon nitride (TaSiN), tantalum aluminum nitride (TaAlN), titanium tungsten (TiW), titanium aluminum (TiAl), titanium oxynitride (TiON), titanium aluminum oxynitride (TiAlON), tungsten oxynitride (WON), and tantalum oxynitride (TaON), or combination thereof.

The second electrode 160 can be, for example, at least one material selected from the group consisting of titanium nitride (TiN), tantalum nitride (TaN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), titanium oxynitride (TiON), titanium aluminum oxynitride (TiAlON), tungsten oxynitride (WON), tantalum oxynitride (TaON), titanium, tungsten, molybdenum, tantalum, titanium silicide, tantalum silicide, and graphite, or combination thereof.

The selection element diode 100 can include an n-type semiconductor 100n and a p-type semiconductor 100p stacked on the substrate 50. The p-type semiconductor 100p can be adjacent to the first electrode 120, and the n-type semiconductor 100n can be adjacent to the word line WL. To reduce contact resistance between the diode 100 and the first electrode 120, a silicide layer 97 can be provided. The silicide layer 97 can be metal silicide such as cobalt silicide, nickel silicide, and titanium silicide.

An interconnection connected to the word line WL through a word line contact 190 (hereinafter, referred to as a strapping word line SWL) is provided on the bit line BL of the memory cell array region. The strapping word line SWL reduces resistance of the word line. Hereinafter, the word line of the cell array region including the strapping word line SWL and the word line on the substrate 50 is referred to as a cell word line, and the word line of the peripheral circuit region is referred to as a circuit word line.

The word line contact 190 can formed on predetermined memory cells. Thus, the word line contact can be formed at every adjacent eight memory cells. Thus, between every adjacent two word line contacts 190 eight memory cells can be provided. Also, the word line contact 190 can be formed at every various irregular number of memory cells. Thus, between the adjacent word line contacts 190 various quantities of, for example 16 or 32, memory cells can be provided. A second metal interconnection M2 that corresponds to the strapping word line SWL can be provided on the first metal interconnection M1 of the peripheral circuit region. The strapping word line SWL and the second metal interconnection M2 can be formed with a thin film. The second metal interconnection M2 can be electrically connected to the first metal interconnection M1 through a via contact 195.

A global bit line GBL is provided on the strapping word line SWL, and a third metal interconnection M3 that corresponds to the global bit line GBL is provided on the second metal interconnection M2. The global bit line GBL and the third metal interconnection M3 can be formed with a thin film. The third metal interconnection M3 can be electrically connected to the second metal interconnection M2 through a via contact. A passivation layer 230 is provided on the global bit line GBL and the third metal interconnection M3.

According to an exemplary embodiment of the present inventive concept, the diode 100, the first electrode 120, and the phase change material layer 140 can be limited in an opening of the dielectric layer, for example, in a contact hole. Hereinafter, a dielectric layer where the diode 100 is formed is referred to as a first dielectric layer 90. Also, a dielectric layer where the first electrode 120 is formed is referred to as a second dielectric layer 110, and a dielectric layer where the phase change material layer 140 is located is referred to as a third dielectric layer 130. Also, a dielectric layer between an area of the bit line BL and the first metal interconnection M1 and an area of the strapping word line SWL and the second interconnection M2 is referred to as a fourth dielectric layer 180, and a dielectric layer between an area of the strapping word line SWL and the second metal interconnection M2 and an area of the global bit line GBL and the third metal interconnection M3 is referred to as a fifth dielectric layer 210.

The diode 100 can be provided in a first contact hole 95 that penetrates the first dielectric layer 90 and exposes the word line WL. Similarly, the first electrode 120 can be provided in a second contact hole 115 that penetrates the second dielectric layer 110 and exposes the diode 100, and the phase change material layer 140 can be provided in a third contact hole 135 that penetrates the third dielectric layer and exposes the first electrode 120. Since the diode 100, the first electrode 120, and the phase change material layer 140 are limited in the contact holes of dielectric layers, density of memory devices is improved, and write current to program the phase change material layer to the RESET state having a high resistance value or SET state having a low resistance value is reduced.

Furthermore, a dielectric spacer 117 can additionally be provided on sides of the second contact hole 115. As a result, a contact area between the first electrode 120 and the phase change material layer 140 can be reduced, and thus write current can be reduced. The word line WL can be formed by forming the device isolation layer 60 at a predetermined region on the substrate 50 to form multiple active regions for word lines followed by ion implantation of impurities. When an active region for a word line is formed in the cell array region, the active region 70 for a MOS transistor 80 which is a drive element can be formed in the peripheral region. For example, when the substrate 50 is a p-type substrate, the word line WL can be formed by ion implantation of n-type impurities. In contrast, the word line WL can be formed using various other methods. For example, the word line WL can be formed by forming multiple parallel epitaxial semiconductor patterns on the substrate 50 followed by ion implantation of impurities.

After forming the word line WL in the peripheral region the MOS transistor 80 is formed on the active region 70 using a known method. The first contact hole 95 that provides the diode 100 can be formed by patterning the first dielectric layer 90. The second contact hole 115 that provides the first electrode 120 can be formed by patterning the second dielectric layer 110. The third contact hole 135 that provides the phase change material 140 can be formed by patterning the third dielectric layer 130.

The diode 100 can be formed by forming a semiconductor layer of Ge, Si, or SiGe in the first contact hole 95 followed by ion implantation of impurities. The semiconductor layer in the first contact hole 95 can be formed using selective epitaxial growth SEG or solid phase epitaxial growth. The selective epitaxial growth is a method used to grow an epitaxial layer using the word line exposed by the first contact hole 95 as a seed layer. In contrast, the solid phase epitaxial growth forms an amorphous semiconductor layer or poly crystal semiconductor layer in the first contact hole 95 followed by crystallization.

The first electrode 120 can be formed by forming the second contact hole 115 that exposes the diode 100 and filling the contact hole with metallic thin film followed by performing a planarization process such as CMP or etch back. The phase change material layer 140 can be formed by forming the third contact hole 135 that exposes the first electrode 120 followed by forming the phase change material layer in the contact hole. Here, various methods can be used to pattern the first through the third dielectric layers 90, 110, and 130 to form the contact holes 95, 115, and 135. For example, as described above in detail, each of the contact holes 95, 115, and 135 can be formed individually, or the three contact holes 95, 115, and 135 can be formed simultaneously by patterning the first through the third dielectric layers 90, 110, and 130 consecutively. Also, by patterning the first and the second dielectric layers 90 and 110 consecutively the first and the second contact holes 95 and 115 can be formed simultaneously, or by patterning the second and the third dielectric layers 110 and 130 consecutively the second and the third contact holes 115 and 135 can be formed simultaneously.

The second electrode 160 and the bit line BL can be formed by forming the phase change material layer 140 and then forming the metallic thin film on the third dielectric layer 130 followed by patterning the third dielectric layer. Also, using a damascene process the second electrode 160 and the bit line BL can be formed. When the bit line BL is formed in the cell array region, the first metal interconnection M1 can be formed in the peripheral region. The contact plug 150 that connects the first metal interconnection M1 to the gate G or the source/drain (S/D) can be formed by faulting the contact hole by patterning the first through the third dielectric layers 90, 110, and 130 followed by filling the contact hole with the metallic thin film. In another embodiment, the contact plug 150 and the first metal interconnection M1 can be formed simultaneously using one process. Thus, after forming the contact hole by patterning the first through the third dielectric layers 90, 110, and 130 and then forming the metallic thin film on the contact hole and the third dielectric layer 130 followed by patterning the metallic thin film, the contact plug 150 and the first metal interconnection Ml can be formed simultaneously.

After forming the bit line BL and the first metal interconnection M1, the fourth dielectric layer 180 is formed, and then the strapping word line SWL and the second metal interconnection M2 can be formed. The second metal interconnection M2 can be electrically connected to the first metal interconnection M1 through the via contact 195 that penetrates the fourth dielectric layer 180. The strapping word line SWL can be connected to the word line WL through the word line contact 190 that penetrates the fourth through the first dielectric layers 180, 130, 110, and 90. The word line contact 190 and the via contact 195 can be formed by forming contact holes by patterning the dielectric layers followed by deposition of the metallic thin film. In other exemplary embodiments, the via contact 195 and the second metal interconnection M2 can be formed simultaneously. Similarly, the strapping word line SWL and the word line contact 195 can be formed simultaneously. After forming the strapping word line SWL and the second metal interconnection M2, the fifth dielectric layer 210 can be formed, and then the global bit line GBL and the third metal interconnection M3 can be formed. In this step, the third metal interconnection M3 can be electrically connected to the second metal interconnection M2 through a via contact 220 that penetrates the fifth dielectric layer 210.

Since the word line contact 190 penetrates the thick fourth through first dielectric layers 180, 130, 110, and 90, it can be formed using multiple contact processes. For example, when the third contact hole 135 for the phase change material layer 140 is formed, as the first step the third through the first dielectric layers can be patterned to form the first word line contact hole that exposes the word line WL. Then, after forming the first word line contact, the fourth dielectric layer can be patterned to form the second word line contact hole that exposes the first word line contact. As a result, the final word line contact including the first and the second word line contacts can be completed.

Similarly, the contact plug 150 that connects the first metal interconnection M1 to the source/drain S/D or the gate G of the drive transistor 80 can be formed using multiple contact processes. When the contact hole process for the diode 90, the first electrode 120, and the phase change material layer 140 is performed in the memory cell array region, the contact hole for the contact plug 150 can be formed in the peripheral circuit region.

In the phase change memory device described in detail above with reference to FIGS. 3 through 5, the drawings illustrate that each of the first through the fifth dielectric layers 90, 110, 130, 180, and 210 and the passivation layer 230 is a single layer; however, according to other exemplary embodiments each layer can be formed as multiple layers. In similar, each of the gate, the metal interconnections M1, M2, and M3, the bit line BL, the strapping word line SWL, contacts, contact plugs, or via contacts are illustrated as a single layer; however, each layer can be formed as multiple layers. Also, the metal interconnections M1, M2, and M3 can be damascene type interconnections formed using a damascene process.

Again referring to FIG. 3, multiple variable resistive elements are formed on the substrate 50. The multiple bit lines BL extended in the first direction and formed separated by the first pitch P1 from each other, the multiple cell word lines WL extended in the second direction and formed on the multiple bit lines BL separated by the second pitch P2 from each other, and a multiple circuit word line WL extended in the first direction and formed on the multiple bit lines BL separated by the third pitch P3 from each other, are disposed on the multiple variable resistive elements. In some exemplary embodiments, the third pitch P3 of the multiple circuit word lines WL is larger than the first pitch P1 of the multiple bit line BL.

As illustrated in FIG. 3, each of the multiple bit lines BL can be electrically connected to each of the multiple circuit word lines WL; specifically, they can be connected through via contact VC. More specifically, the multiple bit lines BL can include the first through nth bit lines arranged in order. Also, the multiple circuit word line WL can include the first through nth circuit word lines that correspond to each of the first through nth bit lines. Each of the first through nth bit lines can be electrically connected to the corresponding one of the first through nth circuit word lines.

Furthermore, some of the multiple circuit word lines WL can be disposed on the first peripheral circuit region, and some of the remaining circuit word lines WL can be disposed on the second peripheral circuit region. Thus, some of the via contacts that connect each of multiple bit lines BL to corresponding multiple circuit word lines WL can be placed in the first peripheral circuit region, and some of the rest can be placed on the second peripheral circuit region. The first peripheral circuit region and the second peripheral circuit region can be disposed on both sides with respect to the cell array region. Thus, some of the via contacts VC can be disposed on one side of the cell array region and can electrically connect some of the multiple circuit word lines WL to the corresponding multiple bit lines BL. Similarly, some of the via contacts VC can be disposed on the other side of the cell array region and can electrically connect some of the multiple circuit word lines WL to the corresponding remaining multiple bit lines BL.

According to the non-volatile memory device based on the exemplary embodiments of the present inventive concept, on the substrate 50 including the cell array region, the first peripheral circuit region formed on one side of the cell array region, and the second peripheral circuit region formed the other side of the cell array region, sequentially disposed first through nth bit lines BL extended in the first direction and separated from each other, sequentially disposed first through mth cell word lines WL extended in the second direction and separated from each other, sequentially disposed first through nth circuit word lines WL that correspond to the first through nth bit lines BL extended in the first direction and separated from each other are disposed. Here, some of the first through nth circuit word lines WL can be disposed on the first peripheral circuit region, and some of the rest first through nth circuit word lines WL can be disposed on the second peripheral circuit region.

The first through nth bit lines BL and the first through nth circuit word lines WL are extended in substantially the same direction and formed, and are electrically connected to the corresponding first through nth bit lines through via contacts VC. Here, some of the first through nth circuit word lines WL and some of the remaining first through nth circuit word lines WL can be placed symmetrically with respect to the cell array region. Here, symmetrical arrangement with respect to the cell array region indicates that the first through nth circuit word lines WL are split and placed on the first and the second peripheral circuit regions placed on both sides with respect to the cell array region. As a result, the pitch P3 of the multiple circuit word lines WL can be defined to be larger than the pitch P1 of the bit lines BL.

As illustrated in FIG. 3, odd numbered lines from the first through nth circuit word lines WL can be placed on the first peripheral circuit region, and even numbered lines from the first through nth circuit word lines WL can be placed on the second peripheral circuit region. In this case, the third pitch P3 of the multiple circuit word lines WL can be approximately twice as large as the first pitch P1 of the multiple bit lines BL.

Therefore, when forming the multiple circuit word lines and the multiple word lines extended in the first direction and the second direction, which is different than the first direction, respectively, by forming the pitch P3 of the multiple circuit word lines extended in the first direction, relatively large overhead for photo etching processes can be reduced. More specifically, in the case of applying a photo etching process when forming the circuit word line and the cell word line, the circuit word line is formed with a pattern extended in the first direction, for example column direction, and the cell word line is formed with a pattern extended in the second direction, for example row direction. Here, as described in detail above, by forming the pitch P3 of the adjacent circuit word line patterns larger than the pitch P1 of the adjacent cell word line patterns, extended patterns can be formed in different directions. As a result, a memory device with improved reliability can be formed. Also, although the pitches for the circuit word line and the cell word line are reduced due to the decrease of a design rule of memory device, overhead during photo process can be reduced when forming patterns extended in different directions.

Also, as described in detail above, since the circuit word line pattern and the cell word line pattern can be defined in a stable fashion, the via contact VC that connects the circuit word line pattern to the cell word line pattern electrically can be defined in a square shape. For example, when the circuit word line cannot be formed in a stable fashion due to the overhead of a photo process, to achieve electrically stable connection between the circuit word line pattern and the cell word line pattern, the via contact VC can be formed in a bar type. As a result, the size of the peripheral circuit region can be increased. However, according to the present inventive concept, since the via contact can be formed in the square shape, the size of the peripheral circuit region can be reduced.

As illustrated in FIGS. 3 through 5, the non-volatile memory device based on the present inventive concept includes sequentially disposed first through nth bit lines BL extended in the first direction and separated from each other, sequentially disposed first through mth circuit word lines WL extended in the second direction and separated from each other, and sequentially disposed first through nth circuit word lines WL that correspond to the first through nth bit lines BL extended in the first direction and separated from each other on the substrate 50 including the cell array region, the first peripheral circuit region, and the second peripheral circuit region. Here, some of the first through nth circuit word lines WL are disposed on the first peripheral circuit region, and some of the rest first through nth circuit word lines WL are placed on the second peripheral circuit region.

The non-volatile memory device according to the exemplary embodiments of the present inventive concept includes sequentially disposed first through nth bit lines BL extended in the first direction and separated from each other, sequentially disposed first through mth cell word lines WL extended in the second direction and separated from each other, and sequentially disposed first through nth circuit word lines WL that correspond to the first through nth bit lines BL extended in the first direction and separated from each other on the substrate 50 including the cell array region, the first peripheral circuit region formed on one side of the cell array region, and the second peripheral circuit region formed on the other side of the cell array region.

As illustrated in FIG. 3, the odd numbered lines from the first through nth circuit word lines WL can be disposed on the first peripheral circuit region, and the even numbered lines from the first through nth circuit word lines WL can be disposed on the second peripheral circuit region. In the drawing, the first through nth circuit word lines are illustrated as being disposed on the first or the second peripheral circuit sequentially and alternatively; however, they can be placed in other configurations, according to embodiments of the inventive concept.

In some exemplary embodiments, for the multiple bit lines extended to the first peripheral circuit region, the cell array region, and the second peripheral circuit region, some of the multiple bit lines can be connected to the circuit word lines in the first peripheral region, but not connected to the circuit word lines in the second peripheral circuit region. Also, some of the multiple bit lines can be connected to the circuit word lines in the second peripheral region, but not connected to the circuit word lines in the first peripheral circuit region. Here, the bit line and the circuit word line can be electrically connected through the via contact VC. As described earlier, the via contact can have a square shape.

Figure 6:
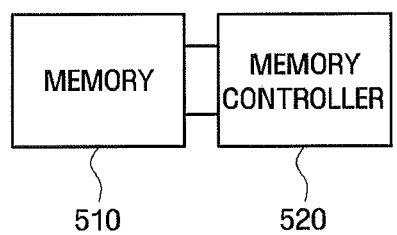
FIGS. 6 through 8 are schematic diagrams illustrating exemplary usage cases of a nonvolatile memory device fabricated according to the exemplary embodiments of the present inventive concept.
Figure 7:
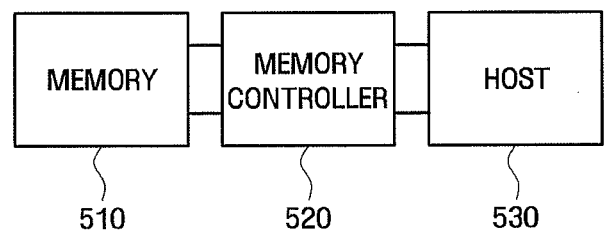
Figure 8:
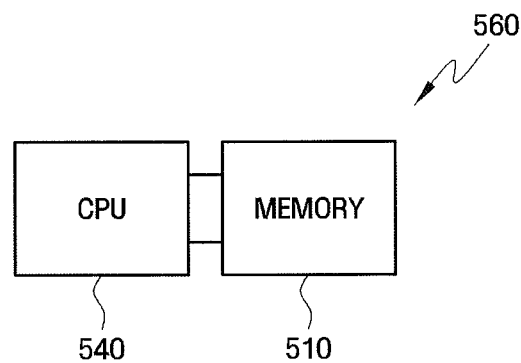

FIGS. 6 through 8 are schematic diagrams illustrating exemplary applications for a nonvolatile memory device according to the exemplary embodiments of the present inventive concept described herein.

Referring to FIG. 6, a system according to an exemplary embodiment of the present inventive concept includes a memory 510 and a memory controller 520 connected to the memory 510. The memory 510 can be a nonvolatile memory device according to any of the exemplary embodiments of the present inventive concept described herein. The memory controller 520 can provide signals to the memory 510 to control operation of the memory 510. For example, the memory controller 520 can provide the memory 510 with command signals and address signals to initiate and control read operations and write operations from and to the memory 510.

A system containing such memory 510 and the memory controller 520 can be embodied in a card such as memory card. Specifically, the system according to embodiments of the present inventive concept can be embodied in an industry standard card used in electronics devices including cellular phones, two-way communication systems, one way pagers, two-way pagers, personal communication systems, portable computers, PDAs, audio and/or video players, digital and/or video cameras, navigation systems, and Global Positioning Systems. However, the inventive concept is not limited thereto, and the system according to the exemplary embodiments of the present inventive concept can be embodied into various devices including memory sticks.

Referring to FIG. 7, a system according to another exemplary embodiment of the present inventive concept can include a memory 510, a memory controller 520, and a host system 530. The memory 510 can be a nonvolatile memory device according to any of the exemplary embodiments of the present inventive concept described herein. The host system 530 is connected to the memory controller 520 through a bus and provides the memory controller 520 with control signals to allow the memory controller 520 to control operations of the memory 510. The host system 530 can be, for example, a processing system used in cellular phones, two-way communication systems, one way pagers, two-way pagers, personal communication systems, portable computers, PDAs, audio and/or video players, digital and/or video cameras, navigation systems, and Global Positioning Systems.

In the embodiment of FIG. 7, although the memory controller 520 is shown to be disposed between the memory 510 and the host system 530, the present inventive concept is not limited to that configuration. In another exemplary embodiment of the present inventive concept, the memory controller 520 can be selectively omitted.

Referring to FIG. 8, a system according to another exemplary embodiment of the present inventive concept can be a computer system 560 that includes a CPU (Central Processing Unit) 540 and a memory 510. The memory 510 can be a nonvolatile memory device according to any of the exemplary embodiments of the present inventive concept described herein. In the computer system 560 the memory 510 can be directly connected to the CPU 540 or connected through typical computer bus architecture and can store an OS (Operating System) instruction set, a BIOS (Basic Input/Output Start up) instruction set, and an ACPI (Advanced Configuration and Power Interface) instruction set. Also, the memory 510 can be used as a mass storage device such as a SSD (Solid State Disk).

In FIG. 8, all components of the computer system 560 are not shown for clarity of illustration and description. Also, in FIG. 11, a memory controller 520 between the memory 510 and the CPU 540 is not shown; however, in another exemplary embodiment of the present inventive concept, a memory controller 520 can be disposed between the memory 510 and the CPU 540.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A nonvolatile memory device, comprising: a plurality of variable resistive elements formed on a substrate; a plurality of bit lines formed on the variable resistive elements, the bit lines being extended in a first direction and separated from each other by a first pitch; a plurality of cell word lines formed on the bit lines, the cell word lines being extended in a second direction and separated from each other by a second pitch; and a plurality of circuit word lines formed on the bit lines, the circuit word lines being extended only in the first direction and separated from each other by a third pitch, wherein the third pitch of the circuit word lines is larger than the first pitch of the bit lines; wherein the substrate includes a cell array region and a peripheral circuit region, the bit lines including first through nth bit lines arranged in order, the circuit word line including first through nth circuit word lines that correspond to the first through the nth bit lines, and the bit lines and the circuit word lines being electrically connected at the peripheral circuit region; wherein the peripheral circuit region includes a first peripheral circuit region formed on one side of the cell array region and a second peripheral circuit region formed on another side of the cell array region, at least some of the first through the nth circuit word lines being disposed on the first peripheral circuit region, and some of remaining first through nth circuit word lines being disposed on the second peripheral circuit region, wherein n is an integer greater than or equal to 2.

2. The nonvolatile memory device of claim 1, wherein the third pitch of the circuit word lines is about twice as large as the first pitch of the bit lines.

3. The nonvolatile memory device of claim 1, wherein each of the bit lines is electrically connected to each of the circuit word lines.

4. The nonvolatile memory device of claim 1, wherein odd numbered lines from the first through the nth circuit word lines are disposed on the first peripheral circuit region, and even numbered lines from the first through the nth circuit word lines are disposed on the second peripheral circuit region.

5. The nonvolatile memory device of claim 1, wherein each of the
first through nth bit lines is electrically connected to each of the first through nth circuit word lines through a first through an nth via contact, some of the first through the nth via contacts being disposed on the first peripheral circuit region, and some of remaining first through nth via contacts are on the second peripheral circuit region.

6. The nonvolatile memory device of claim 5, wherein the first through the nth via contacts have a square shape.

7. The nonvolatile memory device of claim 1, wherein each of the first through nth bit lines are electrically connected to each of the first through nth circuit word lines through via contacts, each of the first through nth bit lines including one side and another side, some of the first through nth bit lines being electrically connected to some of the first through nth circuit word lines at the one side through the via contacts, and some of remaining first through nth bit lines being electrically connected to some of remaining first through nth circuit word lines at the other side through the via contacts.

8. The nonvolatile memory device of claim 7, wherein odd numbered bit lines from the first through nth bit lines are electrically connected to some of the first through the nth circuit word lines at the one side, and even numbered bit lines from the first through nth bit lines are electrically connected to some of remaining first through nth circuit word lines at the other side.

9. The nonvolatile memory device of claim 7, wherein the via contact has a square shape.

10. A nonvolatile memory device, comprising:
a substrate including a cell array region, a first peripheral circuit region formed on one side of the cell array region, and a second peripheral circuit region formed on another side of the cell array region;
first through nth bit lines extended in a first direction, formed on the substrate, separated from each other, and disposed in order;
first through mth cell word lines formed on the first through the nth bit lines, extended in a second direction, separated from each other, and disposed in order; and
first through nth circuit word lines formed on the first through mth word lines, extended only in the first direction, corresponding to the first through the nth bit lines, respectively, separated from each other, and disposed in order, wherein some of the first through nth circuit word lines are disposed on the first peripheral circuit region, and some of remaining first through nth circuit word lines are disposed on the second peripheral circuit region, wherein n and m are integers greater than or equal to 2, without being disposed on the cell array region.

11. The nonvolatile memory device of claim 10, wherein odd numbered circuit word lines from the first through nth circuit word lines are disposed on the first peripheral circuit region, and even numbered circuit word lines from the first through nth circuit word lines are disposed on the second peripheral circuit region.

12. The nonvolatile memory device of claim 10, wherein each of the first through nth bit lines is electrically connected to each of the first through nth circuit word lines through a via contact, each of the first through nth bit lines including one side and another side, some of the first through nth bit lines being electrically connected to some of the first through nth circuit word lines at the one side through the via contacts, and some of remaining first through nth bit lines being electrically connected to some of remaining first through nth circuit word lines at the other side through the via contacts.

13. The nonvolatile memory device of claim 12, wherein odd numbered bit lines from the first through nth bit lines are electrically connected to some of the first through nth circuit word lines at the one side, and even numbered bit lines from the first through nth bit lines are electrically connected to some of remaining first through nth circuit word lines at the other side.

14. The nonvolatile memory device of claim 12, wherein the via contact has a square shape.

15. A nonvolatile memory device, comprising:
a plurality of variable resistive elements formed on a substrate;
a plurality of bit lines formed on the variable resistive elements, the bit lines being extended in a first direction and separated from each other by a first pitch;
a plurality of cell word lines formed on the bit lines, the cell word lines being extended in a second direction and separated from each other by a second pitch; and
a plurality of circuit word lines formed on the bit lines, the circuit word lines being extended in the first direction and separated from each other by a third pitch, wherein the third pitch of the circuit word lines is about twice as large as the first pitch of the bit lines; wherein:
each of the bit lines is electrically connected to each of the circuit word lines;
the substrate includes a cell array region and a peripheral circuit region, the bit lines including first through nth bit lines arranged in order, the circuit word line including first through nth circuit word lines that correspond to the first through the nth bit lines, and the bit lines and the circuit word lines being electrically connected at the peripheral circuit region; and
the peripheral circuit region includes a first peripheral circuit region formed on one side of the cell array region and a second peripheral circuit region formed on another side of the cell array region, at least some of the first through the nth circuit word lines being disposed on the first peripheral circuit region, and some of remaining first through nth circuit word lines being disposed on the second peripheral circuit region, wherein n is an integer greater than or equal to 2 without being disposed on the cell array region.

16. The nonvolatile memory device of claim 15, wherein odd numbered lines from the first through the nth circuit word lines are disposed on the first peripheral circuit region, and even numbered lines from the first through the nth circuit word lines are disposed on the second peripheral circuit region.

17. The nonvolatile memory device of claim 15, wherein each of the first through nth bit lines is electrically connected to each of the first through nth circuit word lines through a first through an nth via contact, some of the first through the nth via contacts being disposed on the first peripheral circuit region, and some of remaining first through nth via contacts are on the second peripheral circuit region.

18. The nonvolatile memory device of claim 17, wherein the first through the nth via contacts have a square shape.

* * * * *